(12) United States Patent
Torres et al.

(10) Patent No.: US 7,605,071 B2
(45) Date of Patent: Oct. 20, 2009

(54) CONTROLLING LATERAL DISTRIBUTION OF AIR GAPS IN INTERCONNECTS

(75) Inventors: Joaquin Torres, St. Martin le Vinoux (FR); Laurent-Georges Gosset, Crolles (FR)

(73) Assignees: STMicroelectronics (Crolles 2) SAS, Crolles (FR); Koninklijke Philips Electronics N.V., Eindhoven (NL)

(*) Notice: Subject to any disclaimer, the term of this patent is extended or adjusted under 35 U.S.C. 154(b) by 62 days.

(21) Appl. No.: 11/482,520

(22) Filed: Jul. 7, 2006

(65) Prior Publication Data

US 2007/0037380 A1    Feb. 15, 2007

(30) Foreign Application Priority Data

Jul. 8, 2005    (EP) ................... 05291485

(51) Int. Cl.
*H01L 21/4763* (2006.01)
(52) U.S. Cl. .................... 438/618; 438/700; 438/787; 257/E21.17; 257/E21.245; 257/E21.277; 257/E21.267; 257/E21.304
(58) Field of Classification Search ............. 438/618, 438/619, 637, 680, 692, 700, 706, 687, 723, 438/743, 756, 762, 787, 931
See application file for complete search history.

(56) References Cited

U.S. PATENT DOCUMENTS 5,461,003 A    10/1995    Havemann et al.

| 6,245,658 | B1 | 6/2001 | Buynoski |
| 6,265,321 | B1 | 7/2001 | Chooi et al. |
| 6,306,754 | B1 | 10/2001 | Agarwal |
| 7,172,980 | B2* | 2/2007 | Torres et al. ............... 438/783 |
| 2002/0028575 | A1 | 3/2002 | Besling et al. |
| 2002/0089060 | A1 | 7/2002 | Morisaki et al. |
| 2002/0090794 | A1 | 7/2002 | Chang et al. |
| 2004/0229454 | A1 | 11/2004 | Torres et al. |
| 2007/0054485 | A1* | 3/2007 | Torres et al. ............... 438/619 |

FOREIGN PATENT DOCUMENTS

FR    2 851 373    2/2003

* cited by examiner

*Primary Examiner*—David Nhu
(74) *Attorney, Agent, or Firm*—Lisa K. Jorgenson; Stephen Bongini; Fleit Gibbons Gutman Bongini & Bianco P.L.

(57) ABSTRACT

Properties of a hard mask liner are used against the diffusion of a removal agent to prevent air cavity formation in specific areas of an interconnect stack. According to one embodiment, there is provided a method in which there is defined a portion on a surface of an IC interconnect stack as being specific to air cavity introduction, with the defined portion being smaller than the surface of the substrate. At least one metal track is produced within the interconnect stack, and there is deposited at least one interconnect layer having a sacrificial material and a permeable material within the interconnect stack. There is defined at least one trench area surrounding the defined portion and forming at least one trench, and a hard mask layer is deposited to coat the trench. At least one air cavity is formed below the defined portion of the surface by using a removal agent for removing the sacrificial material to which the permanent material is resistant.

18 Claims, 10 Drawing Sheets

CONTROLLING LATERAL DISTRIBUTION OF AIR GAPS IN INTERCONNECTS

FIELD OF THE INVENTION

The present invention relates to fabrication of integrated circuits, and in particular relates to a method for controlling lateral distribution of air cavities in metal interconnects.

BACKGROUND OF THE INVENTION

A semiconductor device such as an IC (integrated circuit) has electronic circuit elements such as transistors, diodes and resistors fabricated integrally on a single body of semiconductor material. Advances in semiconductor materials and processing techniques have resulted in reducing the overall size of the IC circuit elements while increasing their number on a single body. Additional miniaturization is highly desirable for improved IC performance and cost reduction.

Typically, device interconnections in Very Large Scale Integrated (VLSI) or Ultra-Large Scale Integrated (ULSI) semiconductor chips are effected by multilevel interconnect structures containing patterns of metal wiring layers. Wiring structures within a given level are separated by an intralevel dielectric forming horizontal connections between electronic circuit elements, while the individual wiring levels are separated from each other by layers of an interlevel dielectric. Conductive vias are formed in the interlevel dielectric to provide interlevel contacts between the wiring traces and form vertical connections between the electronic circuit elements, resulting in layered connections.

Through their effects on signal propagation delays and performance (e.g., time delay and crosstalk), the materials and layout of these interconnect structures can substantially impact chip speed, and thus IC performance. Signal-propagation delays are due to RC time constants ('R' is the resistance of the on-chip wiring, and 'C' is the effective capacitance between the signal lines and the surrounding conductors in the multilevel interconnection stack). RC time constants are reduced by lowering the specific resistance of the wiring material, and by using interlevel and intralevel dielectrics (ILDs) with lower dielectric constants k.

In particular, to further reduce the size of devices on ICs, it has become necessary to use conductive materials having low resistivity and to use insulators having a low dielectric constant (e.g., dielectric constant k of less than 4.0) to also reduce the capacitive coupling between adjacent metal lines. A typical metal/dielectric combination for low RC interconnect structures is copper (Cu) with a dielectric such as silicon dioxide $SiO_2$ (dielectric constant of about 4.0).

Methods of manufacturing interconnects having copper containing materials have been developed where copper-containing interconnect structures are typically fabricated by a "damascene" process. In a typical damascene process, metal patterns, which are inset in a layer of dielectric, are formed by the steps of etching holes (for vias) or trenches (for wiring) into the interlevel or intralevel dielectric, optionally lining the holes or trenches with one or more adhesion or diffusion barrier layers, overfilling the holes or trenches with a metal wiring material (e.g., copper) and removing the metal overfill by a planarizing process such as chemical-mechanical polishing (CMP), leaving the metal even with the upper surface of the dielectric. The above-mentioned processing steps are often repeated until the desired number of wiring and via levels have been fabricated.

Fabrication of interconnect structures by damascene processing can be substantially simplified by using a process variation known as "dual damascene," in which patterned cavities for the wiring level and its underlying via level are filled in with metal in the same deposition step. Dual damascene reduces the number of metal polishing steps by a factor of two, providing substantial cost savings. Dual damascene simply includes forming a trench and an underlying via hole.

Further, in addition to using copper, the use of low k dielectric materials is in heavy demand as they reduce the capacitance between interconnects and improve the switching speed of IC's. When forming vertical and horizontal interconnects by damascene or dual damascene techniques, one or more low k dielectric materials are deposited and pattern etched to form the vertical interconnects (e.g., vias) and horizontal interconnects (e.g., lines).

In back-end-of-line (BEOL) processing, important changes have included the replacement of low-k dielectrics with ultralow-k dielectrics such as air gaps as they have the lowest k value of any material (k value of about 1.0).

Thus, to fulfill future interconnect integration requirements with respect to time delay, cross talk, and power dissipation, and overcome packaging issues, the use of air gaps as the ultimate low-k inter metal dielectric has been widely implemented. As a result, there may be defined specific areas where air gaps must be introduced in the interconnects stack. As shown in FIG. 1, an interconnect stack 10 formed on a silicon substrate 12 may include a high performance area 14 where air cavities must be introduced and areas 16a and 16b which are available for packaging that do not require air cavity introduction.

Typically, as illustrated in FIGS. 2A-2D, integration schemes use a sacrificial material (e.g., Undoped Silicate Glass or USG such as $SiO_2$) 18 deposited at a metal line level 20, a porous material 22 (e.g., a dielectric resin film SiLK™ polymer from Dow Chemical®) and a technique to remove the sacrificial layer, for example, using diluted gaseous or wet HF (Hydrofluoric Fluoride) attack 24 that diffuses through the SILK™ to the USG material (SiLK™ remains unmodified by the process as it is a permeable permanent material). Removal of the sacrificial material 18 results in formation of air cavities 32.

Moreover, in addition to the introduction of a porous insulating material 22 (e.g., SiLK™) and a dense dielectric 18 (e.g., USG) as examples of materials for providing mechanical stability and generating air cavities (air gaps) in-between copper metal lines, the integration of a hard mask 26 on top of the stack 10 to precisely define the region 14 of the stack where air gaps must be introduced has been proposed.

However, when the porous material 22 exhibits a fast diffusion of HF 24 in the lateral dimension of the stack (FIG. 2B), in the bulk of the SiLK™ (as shown by arrow 28) or at the interface SiLK™/USG (arrow 30), it becomes more difficult to control the lateral distribution of air cavities 32 within the stack 10 using such conventional approaches for long HF dips. The disastrous results are thus illustrated in FIGS. 2C-2D; the air cavities extend in the lateral directions beyond the defined region 14 (FIG. 2C) and may even replace all the sacrificial layers 18 (FIG. 2D).

Therefore, there is a need for developing a new and improved method in which air gaps can be formed in an interconnect that addresses the above mentioned problem.

SUMMARY OF THE INVENTION

It is an object of the present invention to provide an improved method for forming air gaps in an interconnect.

One embodiment of the present invention provides a method of fabricating an integrated circuit by producing an integrated circuit interconnect stack having at least one interconnect layer comprising a sacrificial material and a permeable material allowing diffusion of a removal agent. A portion is defined on a surface of the interconnect stack as being specific to air cavity introduction, with this defined portion being smaller than the surface of the substrate. There is defined at least one trench area surrounding the defined portion and at least one trench is formed within the interconnect stack in the trench area. A hard mask layer is deposited to coat the trench, and at least one air cavity is formed below the defined portion of the surface of the substrate by using the removal agent for removing the sacrificial material to which the permeable material is resistant.

Therefore, removal techniques or diffusion (e.g., HF) is laterally controlled while simultaneously and precisely localizing air cavities within the interconnect stack. Accordingly, it is possible to prevent HF diffusion through the polymer material to the areas where air cavities are not required, thus simultaneously achieving the requirements for packaging and signal propagation performance. This method may also be used for an interconnect stack built using a hybrid stack (e.g., a hybrid stack with SiLK™ & UGC) as well as for an interconnect stack formed from a single dense material (e.g., USG).

Another embodiment of the present invention provides an integrated circuit that includes an integrated circuit interconnect stack having at least one interconnect layer comprising a sacrificial material and a permeable material, a defined portion on a surface of the interconnect stack specific to air cavity introduction that is smaller than the surface of the substrate, one trench area surrounding the defined portion and corresponding to at least one trench formed within the interconnect stack, a hard mask layer coating the trench, and at least one air cavity below the defined portion of the surface formed by using a removal agent for removing the sacrificial material to which the permeable material is resistant.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Figure 1:
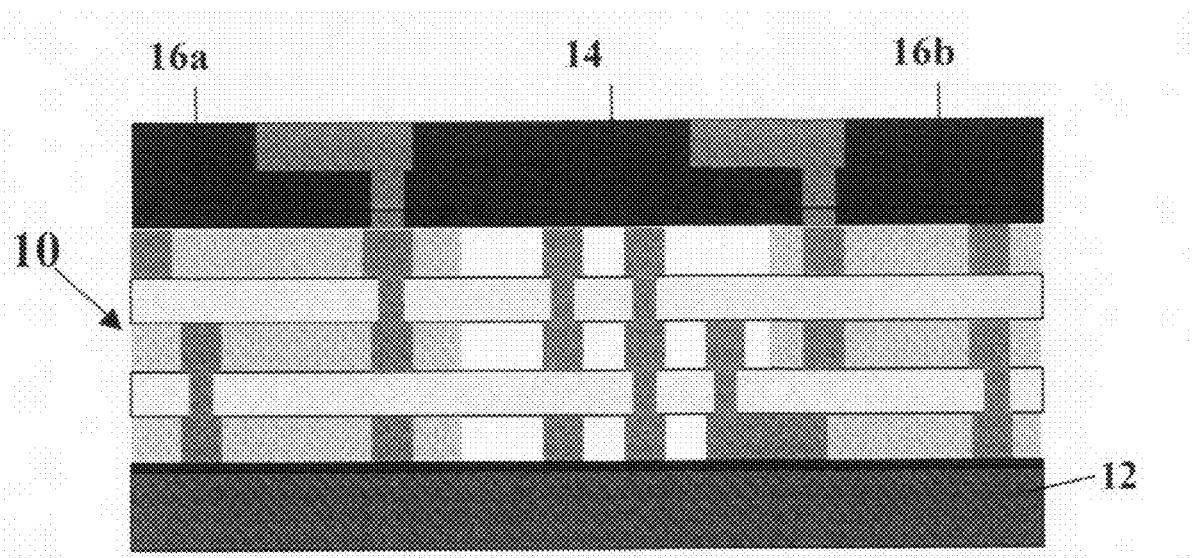
FIG. 1 shows a cross-sectional view of a semiconductor IC interconnect structure where air cavities must be introduced.
Figure 2A:
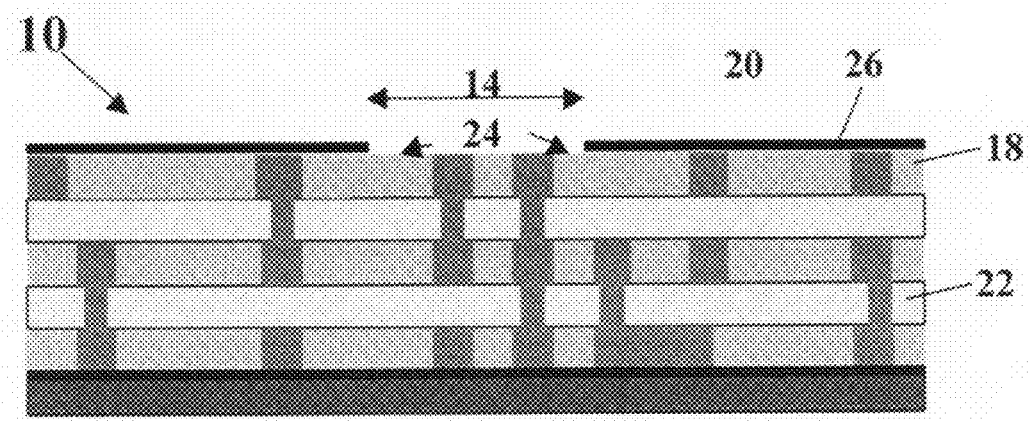
FIGS. 2A-2D show a cross-sectional view of a semiconductor IC interconnect structure where a hard mask has been integrated to define the area for air cavity introduction.
Figure 2B:
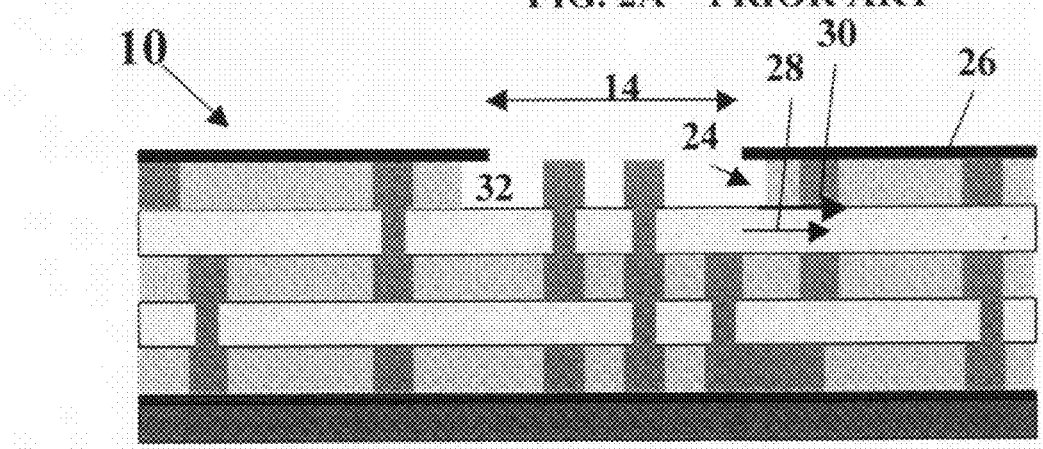
Figure 2C:
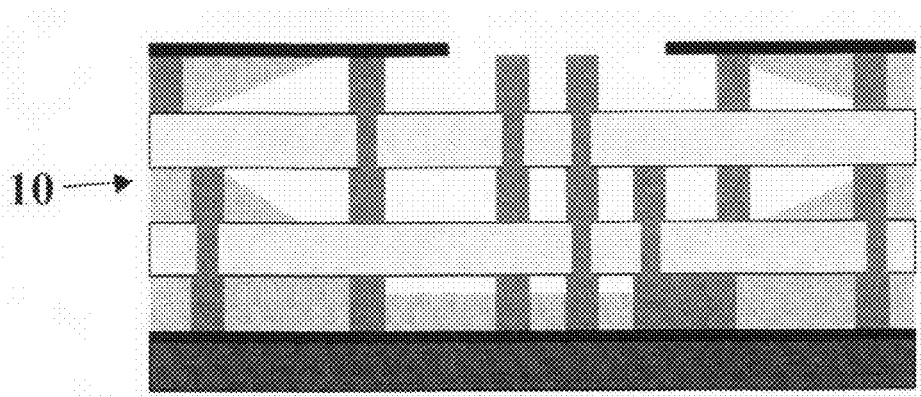
Figure 2D:
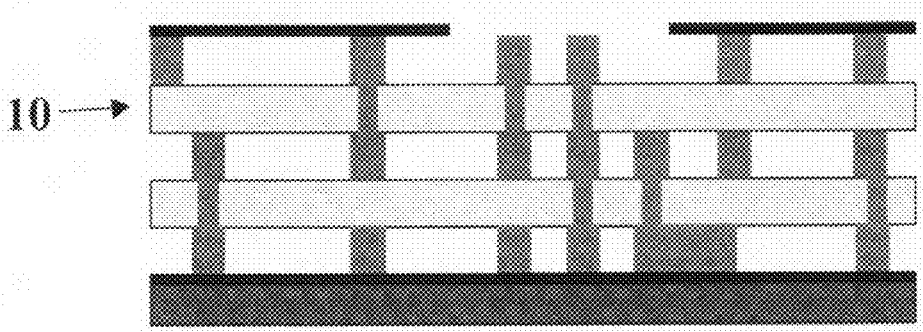

Preferred embodiments of the present invention will be described in detail hereinbelow with reference to the attached drawings.

The present invention, according to a preferred embodiment, provides a method of fabricating an integrated circuit by producing an integrated circuit interconnect stack having at least one interconnect layer comprising a sacrificial material and a permeable material allowing diffusion of a removal agent. A portion is defined on a surface of the interconnect stack as being specific to air cavity introduction, with this defined portion being smaller than the surface of the substrate. There is defined at least one trench area surrounding the defined portion and at least one trench is formed within the interconnect stack in the trench area. A hard mask layer is deposited to coat the trench, and at least one air cavity is formed below the defined portion of the surface of the substrate by using the removal agent for removing the sacrificial material to which the permeable material is resistant.

In one embodiment, the steps of defining at least one trench area surrounding the defined portion and depositing the hard mask layer to coat the trench are replaced with the steps of forming an additional permeable layer above the surface of the interconnect stack, followed by depositing the hard mark layer and a resist layer for a lithographic process, etching the permeable layer and the hard mask layer using a mask suitable to expose at least one area where air cavities are not to be introduced, and performing a second lithographic step for defining the portion on the surface of the substrate of an integrated circuit interconnect stack for air cavity introduction.

Preferably, the trench is thickened by depositing a second hard mask layer, and additional conducting lines and vias are formed within the interconnect stack before the step of forming the air cavity.

In one embodiment, there is controlled the lateral diffusion within the interconnect stack of the removal agent through the sacrificial material.

The step of forming at least one trench may be carried out so as not to extend the depth of the trench to reach the bottom surface of the interconnect stack.

Preferably, an upper metal level is formed subsequent to step of forming at least one air cavity below the defined portion. Moreover, forming the upper metal level preferably includes depositing an upper dielectric level using a chemical vapor deposition process or a spin-on deposition process.

In some embodiments, there is integrated a permeable layer for allowing diffusion of the removal agent as an isolating layer in the upper metal level. The permeable layer may be rigidly stabilized both by lower metal lines of the interconnect stack and by the upper metal level associated with the hard mask layer subsequent to the step of forming the air cavity.

Another embodiment of the present invention provides an integrated circuit that includes an integrated circuit interconnect stack having at least one interconnect layer comprising a sacrificial material and a permeable material, a defined portion on a surface of the interconnect stack specific to air cavity introduction that is smaller than the surface of the substrate, one trench area surrounding the defined portion and corresponding to at least one trench formed within the interconnect stack, a hard mask layer coating the trench, and at least one air cavity below the defined portion of the surface formed by using a removal agent for removing the sacrificial material to which the permeable material is resistant.

Preferably, the interconnect stack also includes conducting lines and vias, and the IC includes a permeable layer allowing diffusion of the removal agent as an isolating layer in an upper metal level. In some embodiments, the IC also includes a rigidly positioned permeable layer stabilized by lower metal lines of the interconnect structure and the upper metal level associated with the hard mask layer.

Embodiments of the present invention have one or more of the following advantages.

The preferred method prevents the uncontrolled HF or chemical diffusion through the polymer material or layers to the areas where air cavities are not required. Furthermore, the preferred method optimizes simultaneously the requirements for IC packaging and signal propagation performances.

The preferred method and IC facilitate the integration of next upper metal level integrations. Further, the preferred method achieves mechanical stability of the permanent porous layer at the upper metal level thus preventing lifting off or collapse into the air cavities of the interconnect stack.

Exemplary embodiments of the present invention will now be described in detail with reference to FIGS. 3A-7H. These figures and the exemplary embodiments are used to describe the principles of the present invention by way of illustration only and should not be construed in any way to limit the scope of the present invention. Those of ordinary skill in the art will understand that the principles of the present invention may be implemented in any suitably arranged image processing system.

In these figures, for the sake of clarity, the dimensions of the various circuit parts have not been drawn to scale. All these figures are sectional views of a semiconductor device comprising various materials attached to an approximately plane surface of a semiconductor substrate. The sectional views are considered in planes perpendicular to the surface of the substrate 12. In the figures, identical reference numerals correspond to identical elements. The substrate is placed in the lower part of each figure.

Moreover, the elementary process steps carried out using methods known to those of ordinary skill in the art will not be explained in detail. Information is given only regarding the combination of these elementary steps in a manner that characterizes embodiments of the present invention.

Referring now to FIGS. 3A-3E, a sequence of integration schemes for forming trenches 34 within the integration stack 10 illustrates principles of one embodiment of the present invention using the properties of SiC (Silicon Carbide) against the diffusion of HF to prevent air cavity formation in specific areas of the interconnect stack 10. In particular, the integration stack 10 has been coated with a hard mask in the form of a SiC liner or layer 26 to isolate dense metallic areas where air cavities must be introduced to the remaining stack.

Figure 3A:
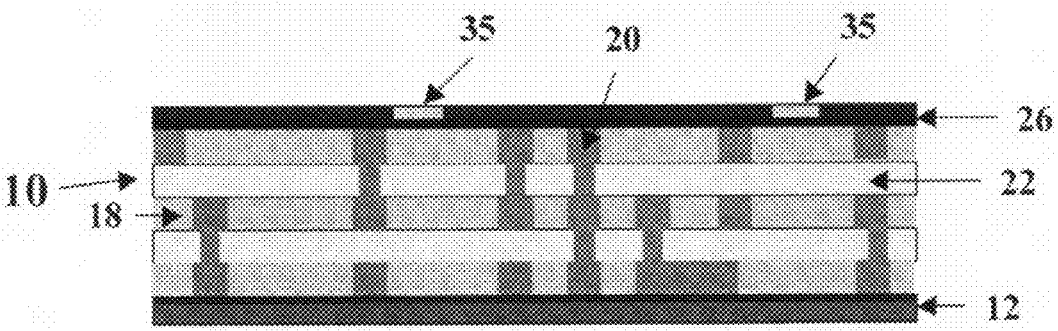
FIGS. 3A-3E are diagrammatic cross-sectional views of a semiconductor interconnect structure illustrating a method in accordance with one embodiment of the present invention.

In FIG. 3A, an interconnect stack 10 is shown where above the semiconductor substrate 12, layers 22 of permanent material such as SiLK, layers of sacrificial material layer USG 18 and metallic elements 20, made of copper, have been formed in a manner known to one of ordinary skill in the art, for example, using damascene techniques.

Figure 3B:
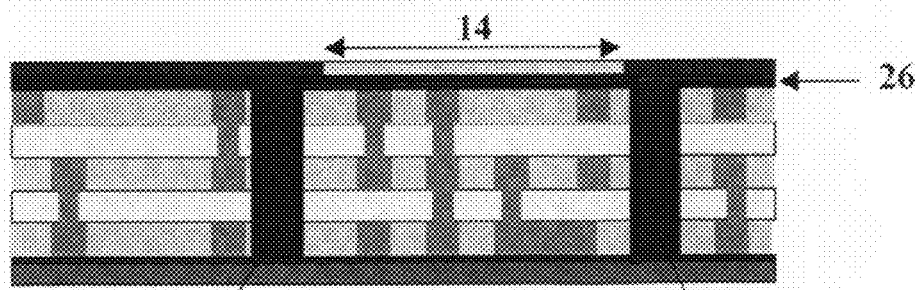

The process of forming air gaps begins with a lithography step that defines open areas 35 in a SIC layer 26 for the creation of trenches 34 surrounding the area where the air cavities will be introduced (FIG. 3A). Then, trenches 34 are formed and the SiC liner 26 is deposited to coat edges 34a and bottom 34b of the trenches 34 (FIG. 3B). Simultaneously, the surface is also coated with the SiC liner 26. An additional lithography step is introduced with large open areas 14 (FIG. 3B).

Figure 3C:
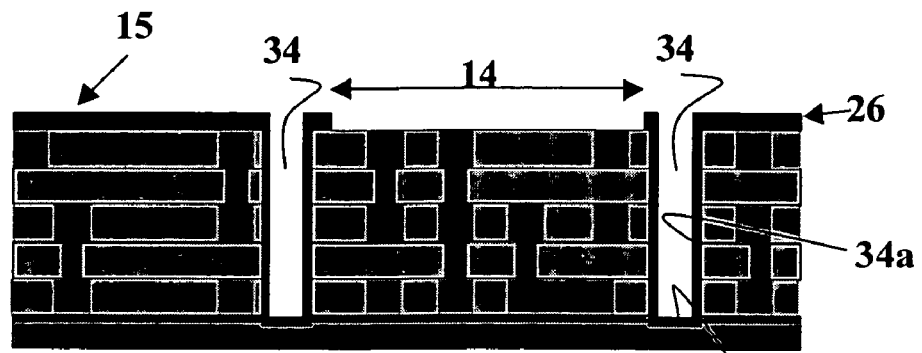
Figure 3D:
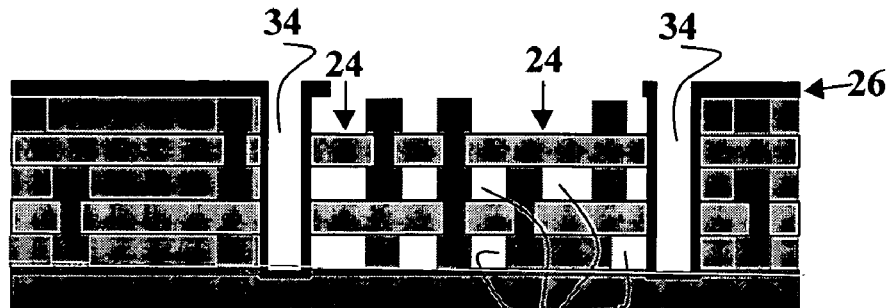

In the air cavity defined area 14 of the upper stack 10 upper surface 15 of the substrate 12, the HF 24 will be able to reach the sacrificial USG 18 top layer and beyond, and diffuse through the different permanent polymer layers (e.g., SiLK™ layers 22) and successively remove the USG layers 18, as shown in FIGS. 3C-3D.

As a result, deep trenches 34 coated with the SiC layer 26 are created flanking a number of air cavities 32 (FIG. 3D).

Referring now to FIGS. 3D1-3D3, in order to optimize the mechanical stability of the SiC coated trenches 34, optimization integration schemes have been implemented. In FIGS. 3D1 and 3D2, a thicker SiC layer 37 is deposited for filling the trenches 34 while potentially introducing air gaps 38 inside the trenches 34 in the case of non-conformal CVD (Chemical Vapor Deposition) properties. In FIG. 3D3, additional conducting lines and vias 31 have been introduced in order to mechanically stabilize the SiC layer 26 as well as the SiLK™ polymer layers 22 during the HF 24 attack.

Figure 3E:
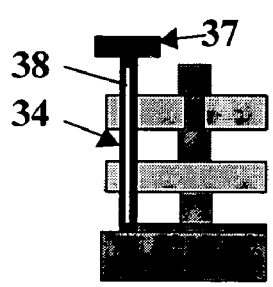
Figure 3E:
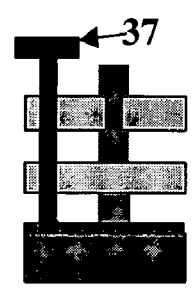
Figure 3E:
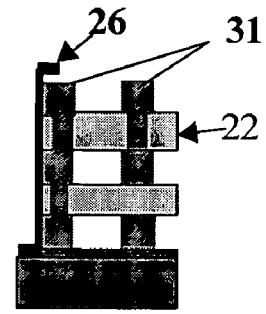
Figure 3E:
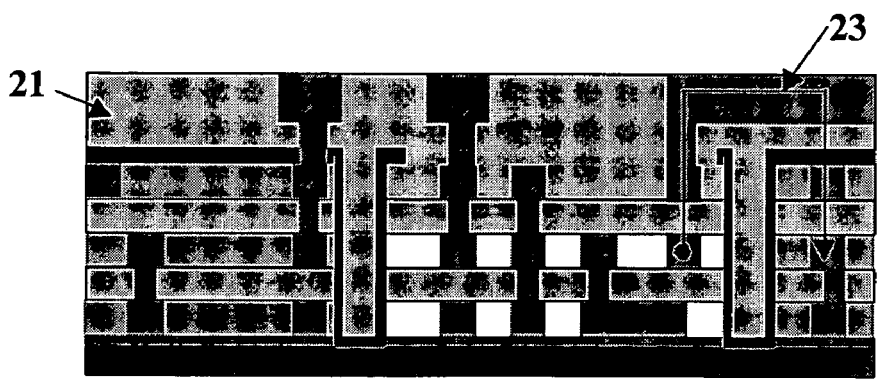

Finally, the integration of the next interconnect metal-level 21 is shown in FIG. 3E, for example, using a spin-on process of deposition of a dielectric material (as opposed to a CVD process).

Additionally, a further optimization involves minimizing the depths of the trenches 34. In other words, when the trenches 34 are introduced through the complete interconnect stack 10 completely surrounding the dense interconnection regions where air cavities 32 are required, the signal propagation from dense areas (with air cavities 32) to the other regions of the interconnect stack 10 is only possible through a conducting way above these metal levels (see arrow 23 in FIG. 3E). Therefore, it is advantageous to minimize the trench 34 depths as well as to prevent the fast HF 24 diffusion.

Figure 4A:
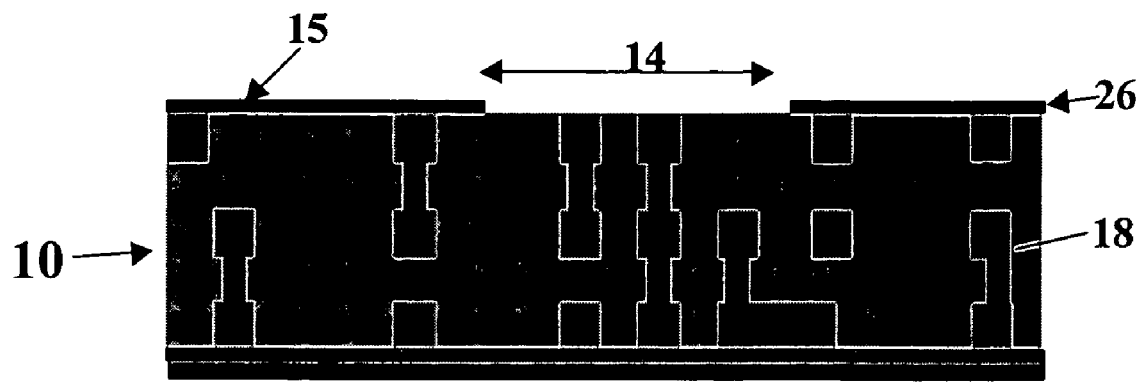
FIGS. 4A-4E are diagrammatic cross-sectional views of a semiconductor interconnect structure illustrating a method in accordance with another embodiment of the present invention.
Figure 4B:
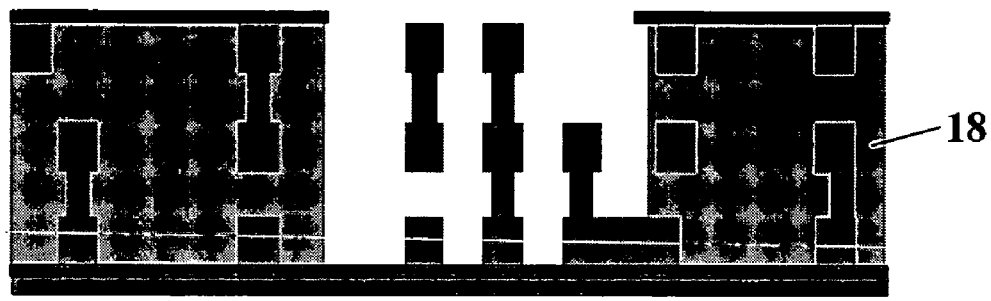
Figure 4C:
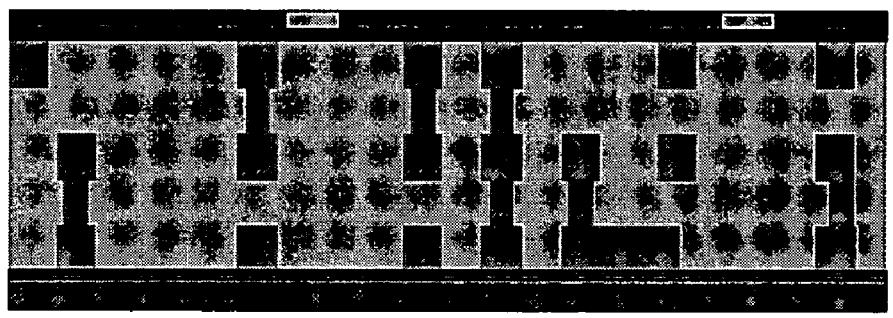
Figure 4D:
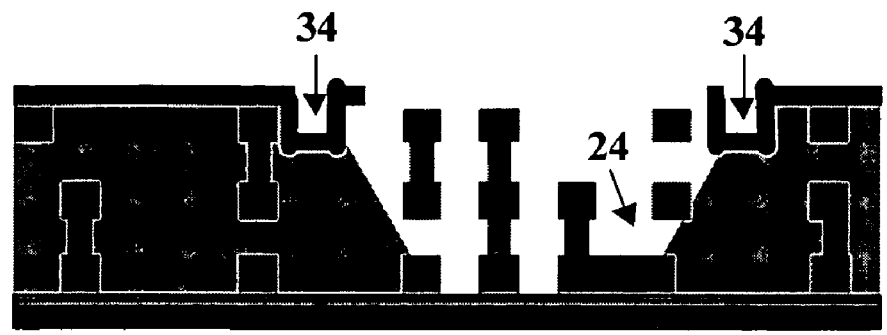
Figure 4E:
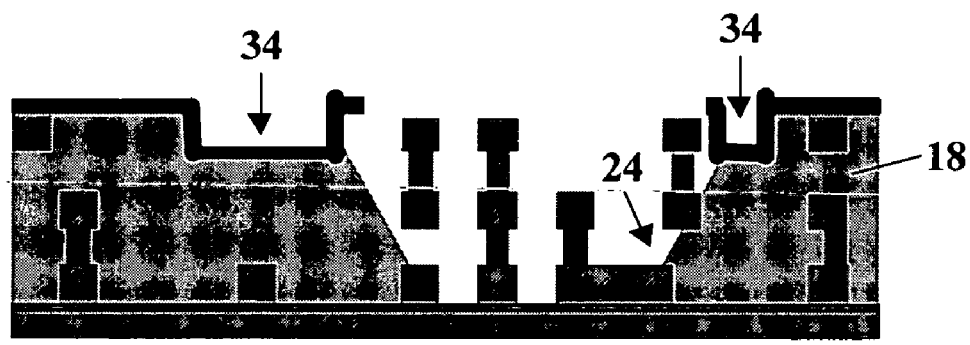

Referring now to FIGS. 4A-4E, for exemplary purposes the interconnect stack 10 is formed using only one sacrificial material USG 18 in this embodiment. Following the integration sequences previously described, the SiC hard liner 26 is deposited and etched using an appropriate mask formed by lithography on the liner 26 at the interconnect stack surface 15, thus defining the large area 14 (FIG. 4A). Then, as illustrated in FIGS. 4B-4C, deep trenches 34 coated with SiC are integrated by using lithography and etching steps. However, unlike the integration scheme shown in FIG. 3D, the vertical length of the SiC coated trenches 34 do not reach the bottom surface 34b of the interconnect stack 10 (FIGS. 4D-4E). In fact, because of the isotropic diffusion of HF in the USG layer 18, the lateral control of air cavities is homogeneous and consistent throughout, as illustrated by arrows 24a.

Another optimization that can be performed is to achieve the next upper metal level integration, i.e., to control and achieve the correct aspect ratio of the trenches 34 before the non-conformal CVD deposition process so that the air cavities 32 close at the same height within the stack 10 to avoid many integration issues such as via and metal line misalignment. This implies strict design rules for interconnect integration at the upper metal layer (e.g., metal line width). Additionally, as an alternative to using a CVD process, spin-on deposition of the dielectric layer may also be used. In that case, since no dielectric layer (e.g., SiLK™) remains within the stack, the spin-on deposited material partially fills the cavities.

Referring now to FIGS. 5A-5E, the optimization for achieving air cavity formation control and formation of the upper metal level is to integrate a permanent layer allowing the diffusion of HF as an isolating layer at the upper metal layer (e.g., SiLK™).

Figure 5A:
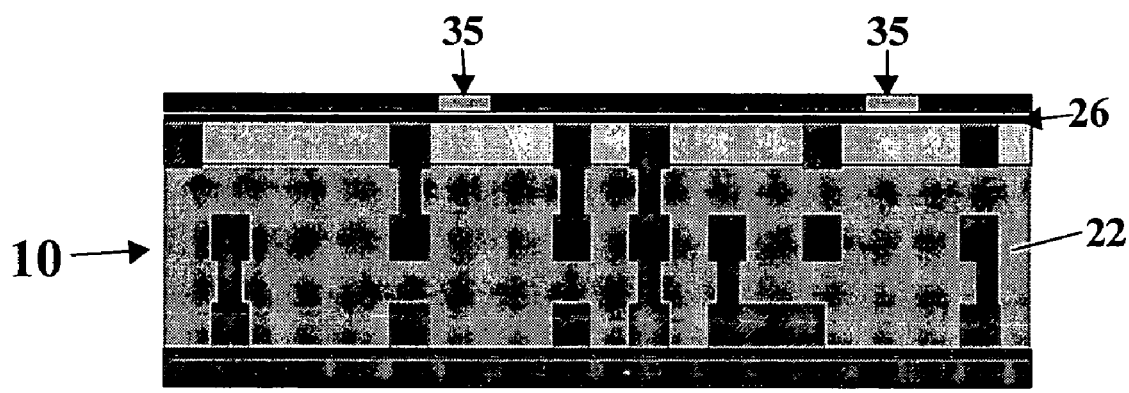
FIGS. 5A-5E are diagrammatic cross-sectional views of a semiconductor interconnect structure illustrating a method in accordance with yet another embodiments of the present invention.
Figure 5B:
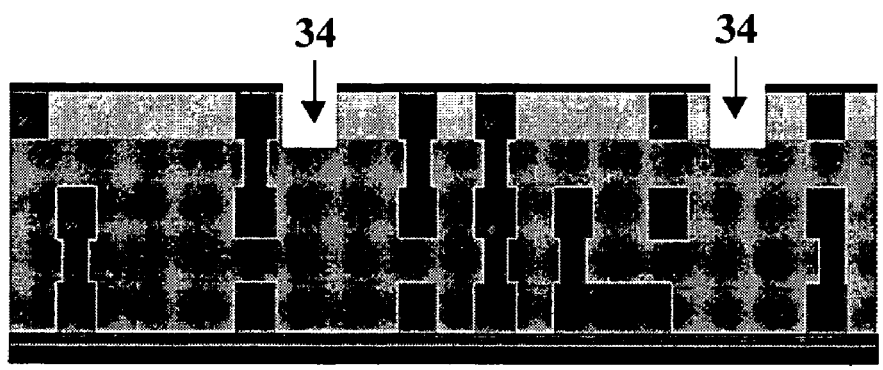
Figure 5C:
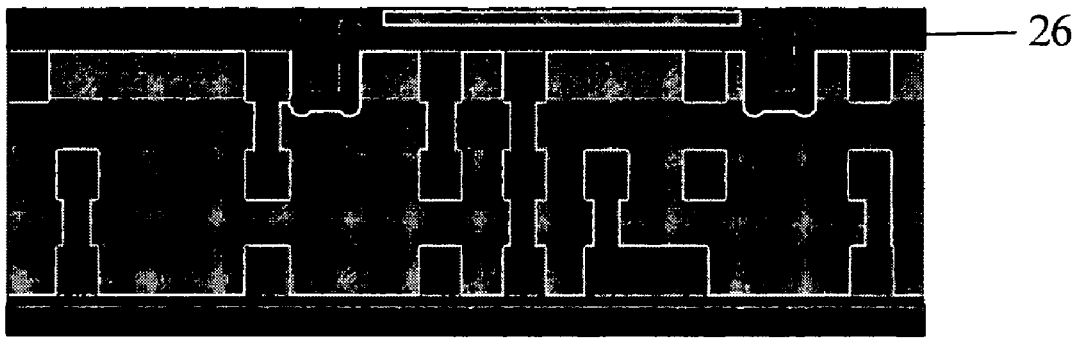
Figure 5D:
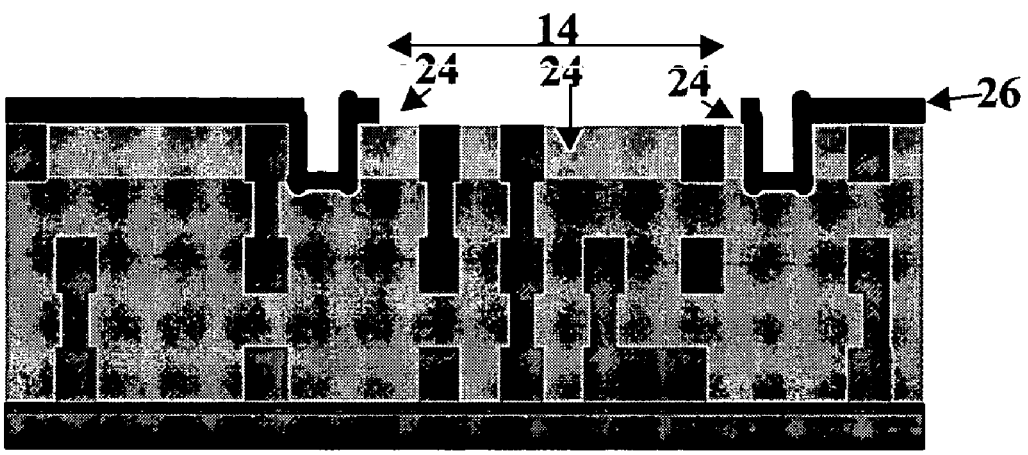
Figure 5E:
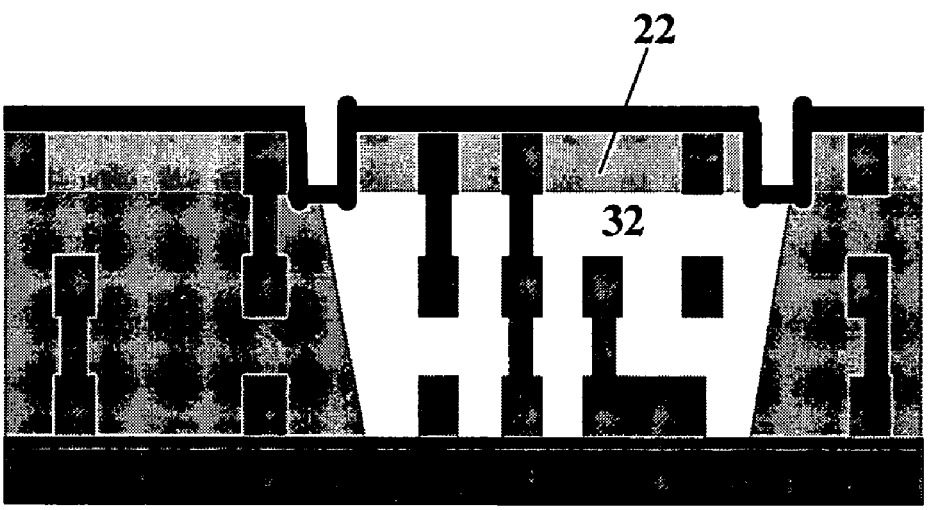

First, a lithography step is carried out to define the trenches area 35 (FIG. 5A). Then, etching steps (e.g., dry etching) are performed (FIG. 5B) to expose the trenches 34. Then, the interconnect stack 10 is further coated with SiC (layer 26, FIG. 5C) extending inside the SiLK layer 22. An additional lithography step is carried out to pattern the SiC layer 26, thus defining the resulting large open area 14 the SiC layer 26 (FIG. 5D). This allows the HF 24 attack of the USG layer 18 within the complete interconnect stack 10 below the as-defined area 14 (FIG. 5E). Consequently, air cavities 32 are formed.

Further, in order to mechanically stabilize the SiLK™ layer 22 (as shown in FIG. 5E) at the upper metal level stack since the different interfaces with the SiLK™ layer 22 would be attacked during the subsequent HF treatment, and prevent the SiLK™ layer 22 in the open area 14 from collapsing within the stack 10 or the air cavities 32, the SILK™ material may be integrated both at the line level and metal level in association with a dual damascene integration scheme.

Figure 6A:
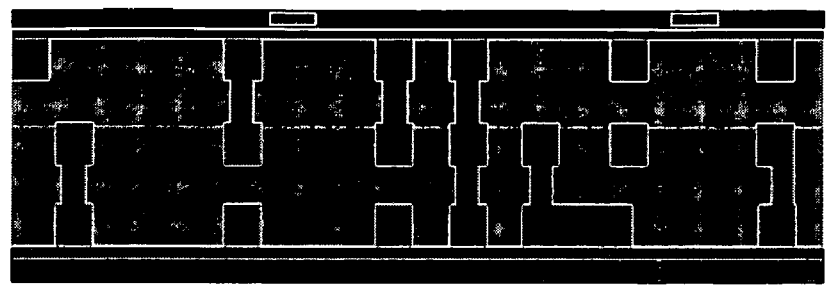
FIGS. 6A-6G are diagrammatic cross-sectional views of a semiconductor interconnect structure illustrating an implementation in accordance with one embodiment of the present invention.
Figure 6B:
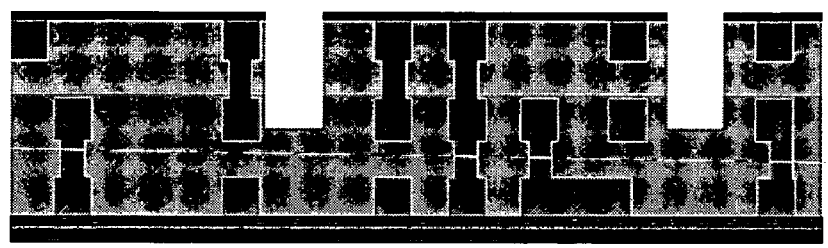
Figure 6C:
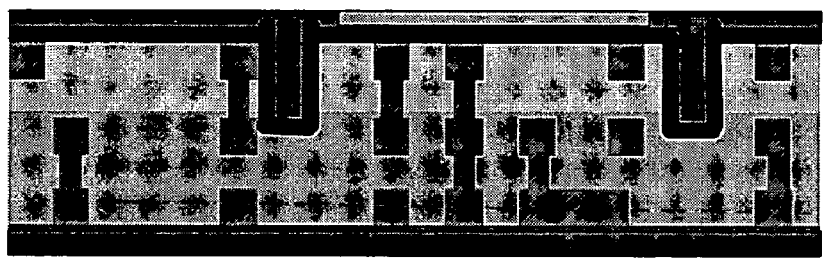
Figure 6D:
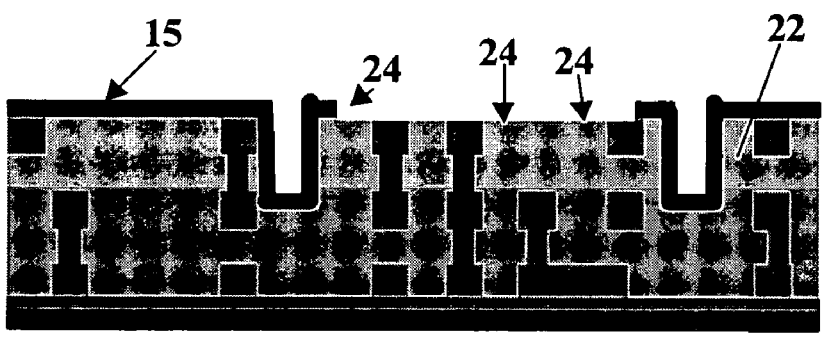
Figure 6E:
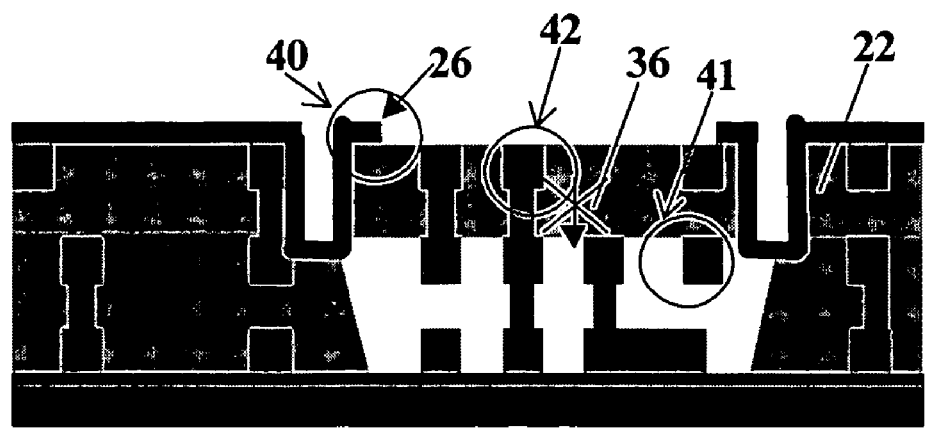

Referring to FIGS. 6A-6G, the initial lithography and etching steps of this embodiment are similar to those described above in FIGS. 5A-5D. The mechanical structure of the SiLK™ layer 22 illustrated in FIG. 5E can be compared to the mechanical structure of the SiLK™ layer 22 as illustrated in FIG. 6E. It can be seen that the HF 24 diffusion performed in FIG. 6D is laterally controlled and the SiLK™ layer 22 remains securely and rigidly held in place at the interconnect stack surface 15. This prevents any collapse (as indicated by arrow 36 in FIG. 6E) of the layer 22 into the air cavities 32. For one, the remaining SiC layer 26 formed about the SiLK™ layer 22 prevents the lifting off of the SiLK™ layer 22 (see bubble area 40) and the SiLK™ layer 22 lies on the metal lines at the lower metal level (see bubble area 41). In addition, metallic lines and vias can also be provided, as previously described, to stabilize the SiLK™ layer 22 within the stack and prevent collapse towards the air cavities 32. Additionally, the dual damascene integration scheme implemented in copper metal integration schemes also prevents lifting off of the SiLK™ layer 22 (bubble area 42).

Figure 6F:
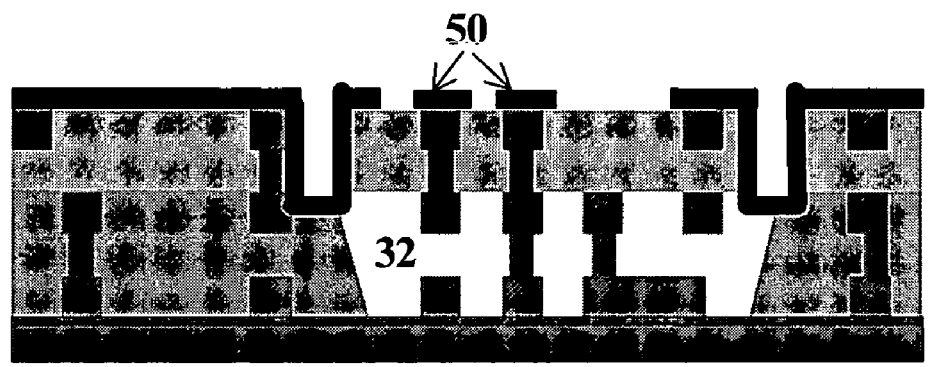

Alternatively, referring to FIG. 6F, a SiC capping 50 may be added by using a more complex second mask during the etching process. In this way, the passivation of the upper metal copper line is achieved as well as the lateral control of air cavities introduction.

Figure 6G:
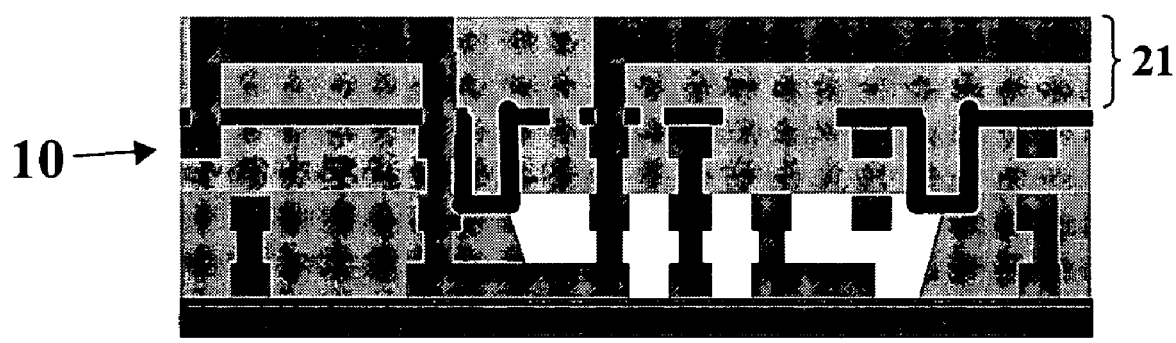

Finally, FIG. 6G shows the final interconnect stack 10 with the formation of the upper metal level 21, subsequent to the formation of the air cavities 32. As mentioned previously, forming the upper metal level 21 may include depositing an upper dielectric level using either a CVD process or a spin-on deposition process.

Referring now to FIGS. 7A-7H, another embodiment of the method for controlling lateral distribution of air cavities in an interconnect stack is shown. Here, the SiC layer 26 is combined with the SiLK™ polymer layer 22 in a method to localize air cavities formation in an interconnect stack formed again solely using a dense sacrificial material (e.g., the USG 18), that is, in a pure USG interconnect stack.

Figure 7A:
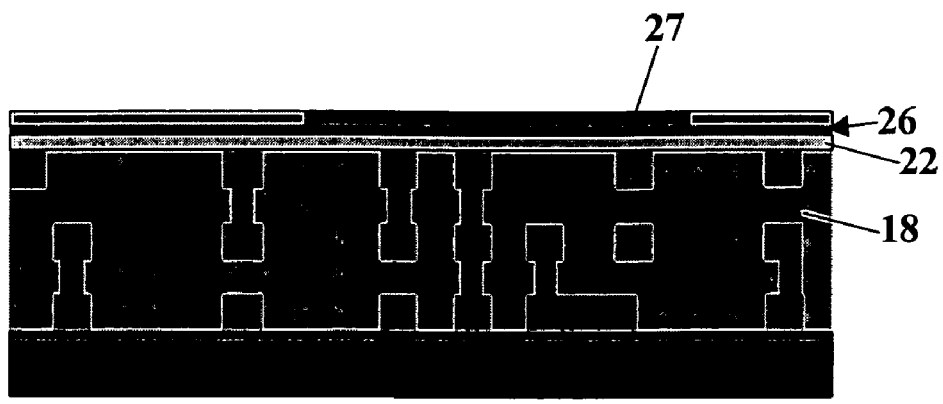
FIGS. 7A-7H are diagrammatic cross-sectional views of a semiconductor interconnect structure illustrating an implementation in accordance with another embodiment of the present invention.
Figure 7B:
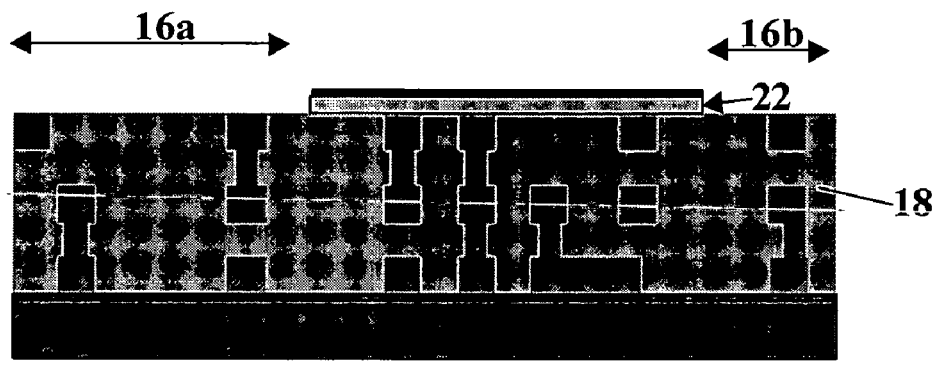

In building the interconnect stack 10, the principle is to combine the properties of the polymer SiLK™ to allow HF 24 diffusion and the properties of a hard SiC layer to resist the HF 24 diffusion, with two lithography steps with large open areas and metallic lines and vias. First, a thin layer of the SiLK™ layer 22 is deposited using a spin-on technique above the interconnect stack 10 (FIG. 7A). Then, the SiC liner 26 and a resist 27 area for lithography purposes are successively formed. In particular, a first dedicated mask with large open areas is used and both the SiC layer 26 and SiLK™ layer 22 are etched (FIG. 7B) mainly above areas where air cavities are not required (areas 16a and 16b).

Figure 7C:
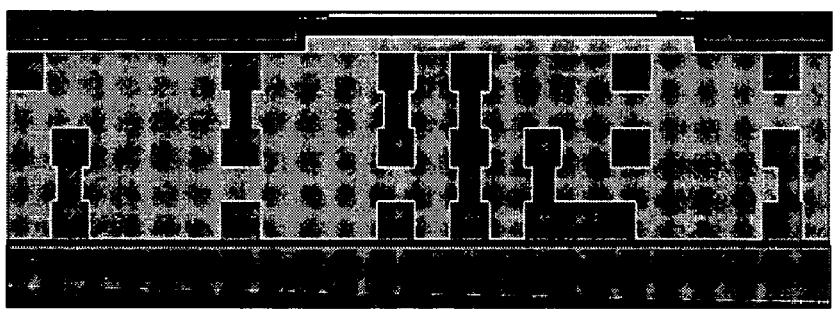
Figure 7D:
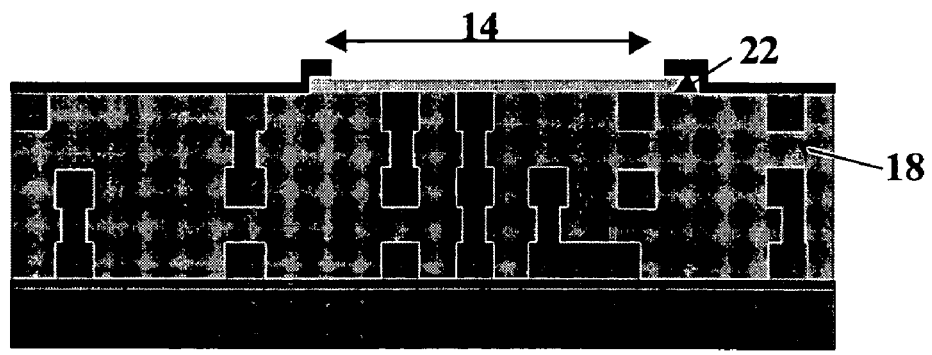
Figure 7E:
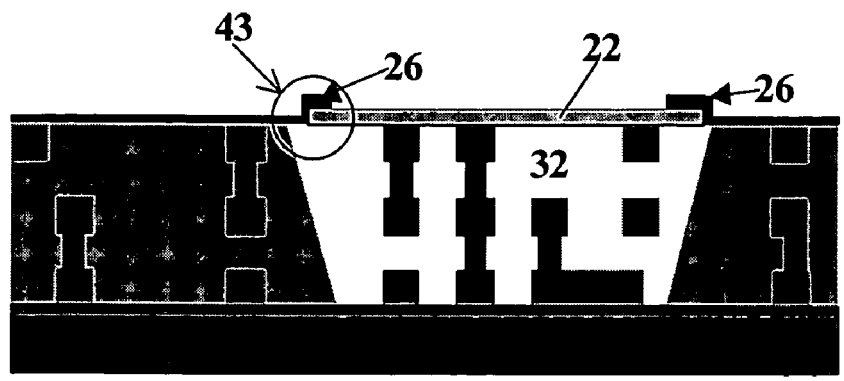
Figure 7F:
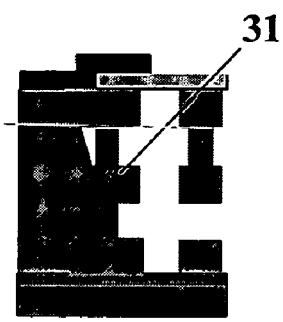
Figure 7G:
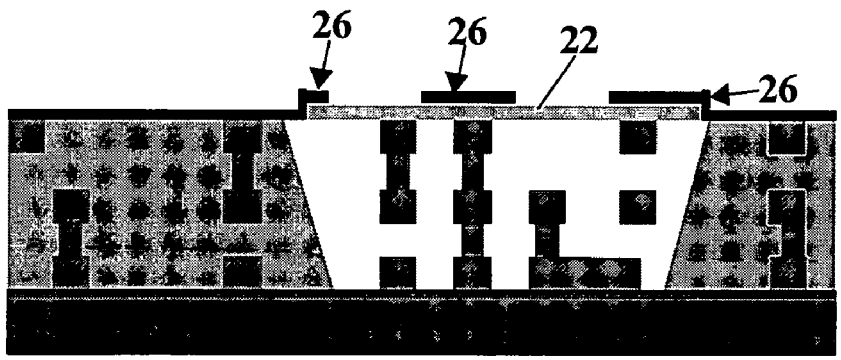

In FIG. 7C, a second lithography step is performed to define the as-defined area 14 where the HF 24 attacks the USG layer 18 in the stack 10 through the SiLK™ layer 22 (FIG. 7D). After the HF 24 attack, the USG layer 18 is removed within the complete interconnect stack 10 (FIG. 7E) creating the area of air cavities 32. The SiLK™ layer 22 is prevented from collapsing or lifting off due to the use of the SiC liner 26 on top of the SiLK™ layer 22 (see bubble area 43). Moreover, the SILK™ layer 22 collapse is further prevented by the implementation of the metallic lines and vias 31 (FIG. 7F).

Alternatively, the SiC layer 26 can be made continuous by using a more complex second mask during the lithography and etching processes by maintaining the SiC liner 26 continuous (FIG. 7G) above the SiLK™ layer 22 in order to further prevent the SiC layer 22 lift off.

Figure 7H:
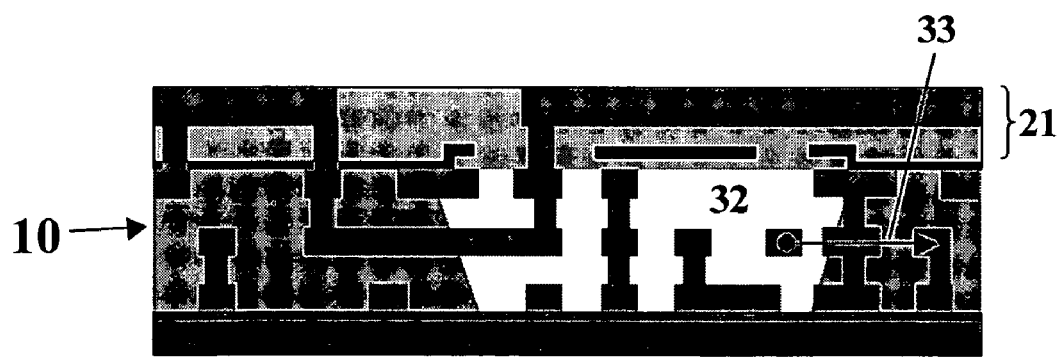

As illustrated in FIG. 7H, the final interconnect stack 10 of this embodiment is shown, with the upper metal level 21 formed thereon.

Using this approach, the air cavities 32 are precisely localized within the stack 10, and the upper metal level 21 can be easily implemented using the deposition of the next dielectric level by CVD or spin-on techniques. Furthermore, this approach allows the signal propagation from low density (with air cavities) to high density areas (without air cavities) at all metal levels (see arrow 33 in FIG. 3E).

Generally, HF chemistry is a technique used to remove sacrificial materials from the interconnect stack. However, in other embodiments, different chemistry treatments may also be used, depending on the composition of the sacrificial material within the stack, such as vapor, gaseous, wet treatments, supercritical $CO_2$ as a solvent or agent, and the like.

While there has been illustrated and described what are presently considered to be the preferred embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method of fabricating an integrated circuit, said method comprising the steps of:
  producing an integrated circuit interconnect stack having at least one interconnect layer comprising a sacrificial material and a permeable material allowing diffusion of a removal agent;
  defining a portion on a surface of the integrated circuit interconnect stack as being specific to air cavity introduction, the defined portion being smaller than the surface;
  defining at least one trench area surrounding the defined portion of the surface of the integrated circuit interconnect stack and forming at least one trench within the integrated circuit interconnect stack in the trench area;

depositing a first hard mask layer to coat the trench; and forming at least one air cavity below the defined portion of the surface of the integrated circuit interconnect stack by using the removal agent for removing the sacrificial material to which the permeable material is resistant.

2. The method of fabricating an integrated circuit according to claim 1, further comprising the step of thickening the trench by depositing a second hard mask layer.

3. The method of fabricating an integrated circuit according to claim 1, further comprising the step of forming a plurality of conducting lines and vias within the integrated circuit interconnect stack before the step of forming the air cavity.

4. The method of fabricating an integrated circuit according to claim 1, further comprising the step of controlling a lateral diffusion within the integrated circuit interconnect stack of the removal agent through the sacrificial material.

5. The method of fabricating an integrated circuit according to claim 1, wherein in the step of forming at least one trench, the depth of the trench does not reach a bottom surface of the integrated circuit interconnect stack.

6. The method of fabricating an integrated circuit according to claim 1, further comprising the step of forming an upper metal level subsequent to the step of forming at least one air cavity below the defined portion.

7. The method of fabricating an integrated circuit according to claim 6, wherein the permeable layer is rigidly stabilized both by lower metal lines of the integrated circuit interconnect stack and by the upper metal level associated with the first hard mask layer subsequent to the step of forming the air cavity by using the removal agent.

8. The method of fabricating an integrated circuit according to claim 6, wherein the step of forming the upper metal level comprises depositing an upper dielectric level using chemical vapor deposition or spin-on deposition.

9. The method of fabricating an integrated circuit according to claim 6, further comprising the step of integrating a permeable layer allowing diffusion of the removal agent, as an isolating layer in the upper metal level.

10. A method of fabricating an integrated circuit, said method comprising the steps of:

producing an integrated circuit interconnect stack having at least one interconnect layer comprising a sacrificial material and a permeable material allowing diffusion of a removal agent;

defining a portion on a surface of the integrated circuit interconnect stack as being specific to air cavity introduction, the defined portion being smaller than the surface;

forming an additional permeable layer above the surface of the integrated circuit interconnect stack, and depositing a hard mask layer and a resist layer for a lithographic process;

etching the additional permeable layer and the hard mask layer using a mask suitable to expose at least one area where air cavities are not to be introduced;

performing a second lithographic step for defining the portion on the surface of the integrated circuit interconnect stack for air cavity introduction; and forming at least one air cavity below the defined portion of the surface of the integrated circuit interconnect stack by using the removal agent for removing the sacrificial material to which the permeable material is resistant.

11. The method of fabricating an integrated circuit according to claim 10, wherein the step of depositing the hard mask layer is performed using chemical vapor deposition.

12. The method of fabricating an integrated circuit according to claim 10, further comprising the step of forming a plurality of conducting lines and vias within the integrated circuit interconnect stack before the step of forming the air cavity.

13. The method of fabricating an integrated circuit according to claim 10, further comprising the step of controlling a lateral diffusion within the integrated circuit interconnect stack of the removal agent through the sacrificial material.

14. The method of fabricating an integrated circuit according to claim 10, wherein in the step of forming at least one trench, the depth of the trench does not reach a bottom surface of the integrated circuit interconnect stack.

15. The method of fabricating an integrated circuit according to claim 10, further comprising the step of forming an upper metal level subsequent to the step of forming at least one air cavity below the defined portion.

16. The method of fabricating an integrated circuit according to claim 15, wherein the permeable layer is rigidly stabilized both by lower metal lines of the integrated circuit interconnect stack and by the upper metal level associated with the hard mask layer subsequent to the step of forming the air cavity by using the removal agent.

17. The method of fabricating an integrated circuit according to claim 15, wherein the step of forming the upper metal level comprises depositing an upper dielectric level using chemical vapor deposition or spin-on deposition.

18. The method of fabricating an integrated circuit according to claim 15, further comprising the step of integrating a permeable layer allowing diffusion of the removal agent, as an isolating layer in the upper metal level.

* * * * *